United States Patent
Weilguni et al.

(10) Patent No.: US 12,207,559 B2
(45) Date of Patent: Jan. 21, 2025

(54) PIEZOELECTRIC TRANSFORMER

(71) Applicant: EPCOS AG, Munich (DE)

(72) Inventors: Michael Weilguni, Hagenberg (AT); Markus Puff, Graz (AT); Pavol Kudela, Deutschlandsberg (AT); Bernhard Döllgast, Deutschlandsberg (AT)

(73) Assignee: TDK Electronics AG, Munich (DE)

( * ) Notice: Subject to any disclaimer, the term of this patent is extended or adjusted under 35 U.S.C. 154(b) by 439 days.

(21) Appl. No.: 17/233,009

(22) Filed: Apr. 16, 2021

(65) Prior Publication Data

US 2021/0234088 A1  Jul. 29, 2021

Related U.S. Application Data

(62) Division of application No. 15/777,625, filed as application No. PCT/EP2016/077719 on Nov. 15, 2016, now abandoned.

(30) Foreign Application Priority Data

Nov. 20, 2015 (DE) .......................... 102015120160.7

(51) Int. Cl.
*H10N 30/40* (2023.01)
*C01B 13/11* (2006.01)
*H05H 1/24* (2006.01)

(52) U.S. Cl.
CPC ............. *H10N 30/40* (2023.02); *C01B 13/11* (2013.01); *C01B 13/115* (2013.01); *H05H 1/24* (2013.01); *C01B 2201/10* (2013.01)

(58) Field of Classification Search
CPC ..... H01L 41/107; H01L 41/047; C01B 13/11; C01B 13/115; C01B 2201/10; H05H 1/24; H05H 1/2481
See application file for complete search history.

(56) References Cited

U.S. PATENT DOCUMENTS 5,705,879 A    1/1998  Abe et al.
6,221,271 B1 * 4/2001  Watanabe ............. H01L 41/107
                                                    252/62.9 PZ (Continued)

FOREIGN PATENT DOCUMENTS

CN    101243731 A    8/2008
CN    106537622 A    3/2017

(Continued)

OTHER PUBLICATIONS

Nadal et al., "First Approach for the Modelling of the Electric Field Surrounding a Piezoelectric Transformer in View of Plasma Generation", IEEE Transactions on Magnetics, Feb. 2012 (Year: 2012).*

(Continued)

*Primary Examiner* — Srinivas Sathiraju
(74) *Attorney, Agent, or Firm* — Slater Matsil, LLP

(57) ABSTRACT

In an embodiment a method includes applying an AC voltage to an input region, converting, by the input region, the AC voltage into a mechanical oscillation, converting, by an output region, the mechanical oscillation into an electrical voltage and igniting a plasma at an output-side end side of an piezoelectric transformer, wherein the piezoelectric transformer includes the input region and the output region, wherein the piezoelectric transformer includes a longest edge and a shortest edge, and wherein the longest edge has a length that is twenty times a length of the shortest edge or less.

23 Claims, 3 Drawing Sheets

(56) References Cited

U.S. PATENT DOCUMENTS

| | | |
|---|---|---|
| 8,109,928 B2 | 2/2012 | Suslov |
| 9,788,404 B2 | 10/2017 | Nettesheim et al. |
| 10,827,599 B2 | 11/2020 | Doellgast et al. |
| 2002/0121845 A1 | 9/2002 | Gueldner et al. |
| 2010/0301702 A1 | 12/2010 | Tao et al. |
| 2010/0328969 A1* | 12/2010 | Meyer ............... H05B 41/2822 363/21.03 |
| 2013/0134838 A1 | 5/2013 | Yun et al. |
| 2013/0299215 A1 | 11/2013 | Taseda et al. |
| 2015/0069911 A1* | 3/2015 | Nettesheim ....... H01J 37/32357 315/111.21 |
| 2015/0373824 A1 | 12/2015 | Nettesheim et al. |
| 2018/0069168 A1 | 3/2018 | Ikeuchi et al. |
| 2018/0287047 A1 | 10/2018 | Rinaldi et al. |

FOREIGN PATENT DOCUMENTS

| | | |
|---|---|---|
| DE | 69510835 T2 | 3/2000 |
| DE | 102013100617 A1 | 7/2014 |
| JP | H10223938 * | 8/1988 |
| JP | H08151265 A | 6/1996 |
| JP | H10223938 A | 8/1998 |
| JP | 2602402 Y2 | 1/2000 |
| JP | 2003297295 A | 10/2003 |
| WO | 2018167156 A1 | 9/2018 |

OTHER PUBLICATIONS

Chih-yi Lin, "Design and Analysis of Piezoelectric Transformer Converters"; section 2.2, p. 11-12; dissertation published on Jul. 15, 1997 (Year: 1997).*
Day et al., "Understanding piezoelectric transformers in CCFL backlight applications", 2002, Texas Instruments Inc., Analog Applications Journal, p. 18-23 (Year: 2002).*
Bronstein, "Piezoelectric Transformers in Power Electronics", Ben-Gurion University of the Negev, PhD thesis, 2005 (Year: 2005).*
Nadal, C., et al., "Analytical Modeling of Electrical Potential Repartition on Piezoelectric Transformer," 2010 IEEE International Frequency Control Symposium, Jun. 1-4, 2010, 6 pages.

* cited by examiner

PIEZOELECTRIC TRANSFORMER

CROSS-REFERENCE TO RELATED APPLICATIONS

This is a divisional application of U.S. application Ser. No. 15/777,625 entitled "Piezoelectric Transformer" which was filed on May 18, 2018, which is a national phase filing under section 371 of PCT/EP2016/077719, filed Nov. 15, 2016, which claims the priority of German patent application 10 2015 120 160.7, filed Nov. 20, 2015, all of which is incorporated herein by reference in its entirety.

TECHNICAL FIELD

The present invention relates to a piezoelectric transformer. The piezoelectric transformer can be used for generating plasma, in particular a non-thermal atmospheric pressure plasma.

BACKGROUND

In the case of known parallelepipedal piezoelectric transformers it has been observed that plasma ignitions occur along the longitudinal-side edges of the output region. The plasma ignitions lead to undesired back coupling involving the generation of mechanical stresses in a piezoelectric material of the output region, which can lead to cracks in the material. The lifetime of the piezoelectric transformer can be shortened as a result.

SUMMARY

Embodiments provide an improved piezoelectric transformer which can have a longer lifetime, for example.

Embodiments provide a piezoelectric transformer comprising an input region and an output region, wherein the input region is configured to convert an applied AC voltage into a mechanical oscillation, and wherein the output region is configured to convert a mechanical oscillation into an electrical voltage. Furthermore, the piezoelectric transformer comprises a longest edge and a shortest edge, wherein the longest edge comprises a length that is a twenty times the length of the shortest edge or less.

In various embodiments the ratio of the length of the longest edge to the length of the shortest edge is also referred to as aspect ratio. It was possible to show that undesired plasma ignitions along the longitudinal-side edge in the output region can be avoided in the case of piezoelectric transformers having an aspect ratio of ≤20:1. Accordingly, considerable mechanical loadings of the piezoelectric material in the output region do not occur in the case of these transformers, with the result that no cracks arise here and the lifetime is not shortened.

The piezoelectric transformer can be, for example, a Rosen-type transformer. The piezoelectric transformer can furthermore be designed in such a way that the aspect ratio is 2:1, preferably 5:1.

In this case, the term edges can denote the lines at which two side surfaces of the piezoelectric transformer abut one another.

The piezoelectric transformer can be substantially parallelepipedal. In this case, the edges of the transformer can be rounded. In particular, the edges can be rounded with a very small radius, which is, for example, 0.5 mm.

The longest edge can extend in a longitudinal direction from an input region toward an output region. The shortest edge can be an edge of an output-side end side. The output-side end side is an end surface facing away from the input region.

In various embodiments, the piezoelectric transformer having an aspect ratio of ≤20:1 has a longer lifetime since considerable mechanical loadings of the output region do not occur. Furthermore, the transformer has further advantages. The preferred aspect ratio of ≤20:1 leads to an improved ozone generation efficiency. In particular, more ozone can be produced with the input power remaining the same per unit volume of the piezoelectric transformer given the aspect ratio of ≤20:1. The improvement in the ozone generation efficiency is based on an improvement in the matching of the output impedance of the piezoelectric transformer to the impedance generated by the plasma, which is established in the case of the aspect ratio of ≤20:1.

The piezoelectric transformer can be a piezoelectric transformer for generating plasma. In this case, the plasma is preferably non-thermal atmospheric pressure plasma.

In various other embodiments, the longest edge comprises a length of less than 45 mm. Preferably, the longest edge comprises a length of less than 35 mm. The longest edge can comprise a minimum length of 10 mm.

Such a shortened design of the piezoelectric transformer may have numerous advantages. The polarization voltage required for the polarization of such a piezoelectric transformer is substantially dependent on the length of the piezoelectric transformer. Accordingly, only a low voltage is required for the polarization of a transformer whose longest edge comprises a length of less than 45 mm, or of less than 35 mm. The method for producing the respective piezoelectric transformer is simplified as a result.

In various embodiments, the resonant frequency of the respective piezoelectric transformer is dependent on the length of the longest edge. A short length of the longest edge makes it possible to manufacture piezoelectric transformers having a high resonant frequency. By way of example, a resonant frequency of more than 100 kHz can be achieved by means of a longest edge that is shorter than 35 mm. Such resonant frequencies are advantageous particularly in the case of plasma generators used in medical applications.

In other embodiments, a higher resonant frequency leads to steeper edges of the output voltage, which in turn have a positive effect on the ozone generation efficiency.

A first external electrode can be arranged on a first side surface of the input region. A second external electrode can be arranged on a second side surface of the input region, the second side surface being situated opposite the first side surface. The input region can comprise piezoelectric layers and electrodes stacked one above another in a stacking direction. The electrodes can be contacted either with the first external electrode or with the second external electrode alternately in the stacking direction. The output region can comprise a monolithic piezoelectric layer. The piezoelectric material of the piezoelectric layer in the output region can be identical to the piezoelectric material of the piezoelectric layers in the input region.

The longest edge can extend from the input region to the output region. The shortest edge can be perpendicular to the longest edge.

The piezoelectric transformer can have a resonant frequency of more than 100 kHz. These frequencies are advantageous particularly for applications in the medical sector.

The longest edge can comprise a length that is a fifteen times the length of the shortest edge of the piezoelectric transformer or less. Accordingly, an aspect ratio of 15:1 can be established. Choosing the aspect ratio to be so small makes it possible to ensure that plasma ignitions do not occur along the longitudinal-side edges. The ozone generation efficiency can also be increased further in this way.

The shortest edge can comprise a length of between 10 mm and 1 mm. Preferably, the shortest edge comprises a length of between 5 mm and 2 mm. The length of the shortest edge is chosen such that an advantageous aspect ratio of ≤20:1 is established.

Plasma ignitions along the longest edge in the output region can be avoided by means of the ratio of the length of the longest edge to the length of the shortest edge. Accordingly, an insulation, for example, a shrinkable sleeve that partly sheathes the output region, can be dispensed with. The piezoelectric transformer can thus be free of an insulation in the output region. The piezoelectric insulator can in particular comprise no shrinkable sleeve.

Mechanical loadings of the piezoelectric material in the output region can be reduced by means of the ratio of the length of the longest edge to the length of the shortest edge.

An improved ozone generation efficiency can be achieved by means of the ratio of the length of the longest edge to the length of the shortest edge. In particular, this choice of the aspect ratio can make it possible to reduce the component size and at the same time to maintain or even improve the ozone generation efficiency.

A further aspect of the present invention relates to a plasma generator comprising the piezoelectric transformer described above. The plasma generator can be suitable in particular for generating a non-thermal atmospheric pressure plasma.

BRIEF DESCRIPTION OF ILLUSTRATIVE EMBODIMENTS

The present invention is described below with reference to the figures.

DETAILED DESCRIPTION OF ILLUSTRATIVE EMBODIMENTS

Figure 1:
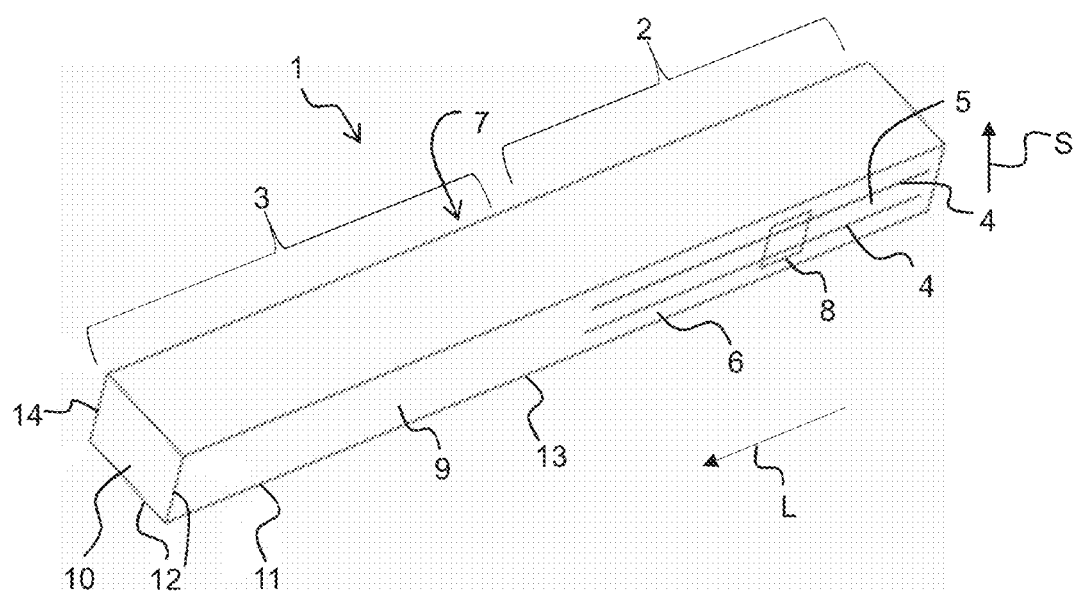
FIG. 1 shows a piezoelectric transformer in perspective view.

FIG. 1 shows a piezoelectric transformer 1 in a perspective view. The piezoelectric transformer 1 can be used in particular in a device for generating non-thermal atmospheric pressure plasma.

A piezoelectric transformer 1 is a design of a resonance transformer which is based on piezoelectricity and constitutes an electromechanical system, in contrast to the conventional magnetic transformers. The piezoelectric transformer 1 is a Rosen-type transformer, for example.

The piezoelectric transformer 1 comprises an input region 2 and an output region 3. In the input region 2, the piezoelectric transformer 1 comprises electrodes 4, to which an AC voltage can be applied. The electrodes 4 extend in a longitudinal direction L of the piezoelectric transformer 1. The electrodes 4 are stacked alternately with a piezoelectric material 5 in a stacking direction S, which is perpendicular to the longitudinal direction L. The piezoelectric material 5 here is polarized in the stacking direction S.

Electrodes 4 are arranged in the interior of the piezoelectric transformer 1 and are also referred to as internal electrodes. The piezoelectric transformer 1 comprises a first side surface 6 and a second side surface 7 situated opposite the first side surface 6. A first external electrode 8 is arranged on the first longitudinal side 6. A second external electrode (not shown) is arranged on the second side surface 7. The internal electrodes 4 are electrically contacted with either the first external electrode 8 or the second external electrode alternately in the stacking direction S.

The input region 2 can be driven with a low AC voltage that is applied between the electrodes 4. On account of the piezoelectric effect, the AC voltage applied on the input side is firstly converted into a mechanical oscillation. In this case, the frequency of the mechanical oscillation is essentially dependent on the geometry and the mechanical construction of the piezoelectric transformer 1.

The output region 3 comprises piezoelectric material 9 and is free of internal electrodes. The piezoelectric material 9 in the output region is polarized in the longitudinal direction L. The piezoelectric material 9 of the output region 3 can be the same material as for the piezoelectric material 5 of the input region 2, wherein the piezoelectric materials 5 and 9 can differ in their direction of polarization. In the output region, the piezoelectric material is shaped to form a single monolithic layer, which is polarized completely in the longitudinal direction L. In this case, the piezoelectric material in the output region has only a single direction of polarization.

If an AC voltage is applied to the electrodes 4 in the input region 2, then a mechanical wave forms within the piezoelectric material 5, 9, the wave generating an output voltage as a result of the piezoelectric effect in the output region 3. The output region 3 comprises an output-side end side 10. The electrical voltage generated in the output region 3 is thus present between the end side 10 and the end of the electrodes 4 of the input region 2. In this case, a high voltage is present at the output-side end side 10. In this case, a high potential difference also arises between the output-side end side and an environment of the piezoelectric transformer, the potential difference being sufficient to generate a strong electric field that ionizes a process gas.

In this way, the piezoelectric transformer 1 generates high electric fields that are able to ionize gases or liquids by electrical excitation. In this case, atoms or molecules of the respective gas or of the respective liquid are ionized and form a plasma. An ionization occurs whenever the electric field strength at the surface of the piezoelectric transformer 1 exceeds the ignition field strength of the plasma. In this case, the term ignition field strength of a plasma denotes the field strength required for ionizing the atoms or molecules.

Plasma ignitions occur both at the lateral longitudinal edges 11 and at the edges 12 of the output-side end side 10. The plasma ignitions along the lateral longitudinal edges 11 lead to undesired back coupling involving the generation of high mechanical stresses in the piezoelectric material 9 of the output region 3, which can lead to cracks during continuous operation of the piezoelectric transformer 1, as a result of which the lifetime of the piezoelectric transformer 1 is reduced. In order to avoid such damage to the piezoelectric transformer 1 on account of the plasma ignition, the piezoelectric transformer 1 is configured in such a way that the plasma ignition appears primarily at the output-side end side 10 and the plasma ignition at the lateral longitudinal edges 11 is avoided.

In the case of the piezoelectric transformer 1, a plasma ignition occurs in particular at the locations at which a maximum of the electrical potential occurs in the output region 3 of the piezoelectric transformer 1. A more detailed explanation is given below of how the piezoelectric transformer 1 is designed to avoid the plasma ignition at the lateral longitudinal edges 11 if possible.

The piezoelectric transformer 1 comprises a parallelepipedal shape, wherein the piezoelectric transformer 1 comprises a longest edge 13 and a shortest edge 14. The output-side end side 10 comprises a rectangular shape, wherein the shortest edge of the end side 10 constitutes the shortest edge 14 of the piezoelectric transformer 1. The longest edge 13 of the piezoelectric transformer 1 is perpendicular to the output-side end side 10 and extends from the input region 2 to the output region 3. The longest edge 13 is a lateral longitudinal edge ii.

The ratio of the length of the longest edge 13 to the length of the shortest edge 14 is referred to as aspect ratio. It has been found that the piezoelectric transformer 1 generates plasma in particular to an intensified extent at the output-side end side 10 if the piezoelectric transformer 1 is designed in such a way as to result in an aspect ratio of ≤20:1.

The aspect ratio affects the capacitance of the output region 3 of the piezoelectric transformer 1. The location at which a maximum of an electrical potential is attained in the output region 3 shifts in turn depending on the capacitance of the output region 3. The output capacitance increases as the aspect ratio decreases. It was possible to show both experimentally and theoretically that a sufficiently high output capacitance for which the maximum of the generated output potential lies on the output-side end side 10 is achieved in the case of an aspect ratio of ≤20:1. If the aspect ratio is chosen to be greater than 20:1, the output capacitance decreases and the maximum of the output potential shifts along the lateral longitudinal edges 11 away from the output-side end side 10 in a direction toward the input region 2. In this case, undesired plasma ignitions occur along the edges 11.

In a first exemplary embodiment, the longest edge 13 comprises a length of 41 mm. The edges 12 of the output-side end side 10 comprise a length of 6 mm and 3 mm. Accordingly, the 3 mm long edge of the end side 10 is the shortest edge 14 of the piezoelectric transformer 1. This results in an aspect ratio of 13.667:1, i.e., an advantageous aspect ratio that is less than or equal to 20:1.

In an experimental investigation, ten piezoelectric transformers 1 in accordance with the first exemplary embodiment were studied in the course of continuous operation of 1000 hours, wherein a crack was produced in the output region 3 in none of the transformers 1 and accordingly no failure of any of the piezoelectric transformers 1 occurred.

In accordance with a second exemplary embodiment, the longest edge 13 can be less than 35 mm. By way of example, the piezoelectric transformer 1 can comprise a longest edge 13 having a length of 30 mm. The end side 10 comprises edge lengths of 3 mm and 2.4 mm. The advantageous aspect ratio of ≤20:1 results in this case, too. In particular, an aspect ratio of 12.5:1 results.

The resonant frequency of the piezoelectric transformer 1 is dependent on the length of the longest edge 13. The second exemplary embodiment leads to a resonant frequency of more than wo kHz.

Piezoelectric transformers 1 having a resonant frequency of more than wo kHz are usable in particular for medical applications. Cutting tissue by means of plasma cutting is an example of such a medical application. The irritation of nerves should be avoided in this case. The ionic conductivity of nerves decreases significantly at frequencies starting from wo kHz. Accordingly, plasma generators which operate at frequencies of above wo kHz are particularly well suited to the plasma cutting of tissue. The above-described piezoelectric transformer 1 in accordance with the second exemplary embodiment can be used in such a plasma generator.

Figure 2:
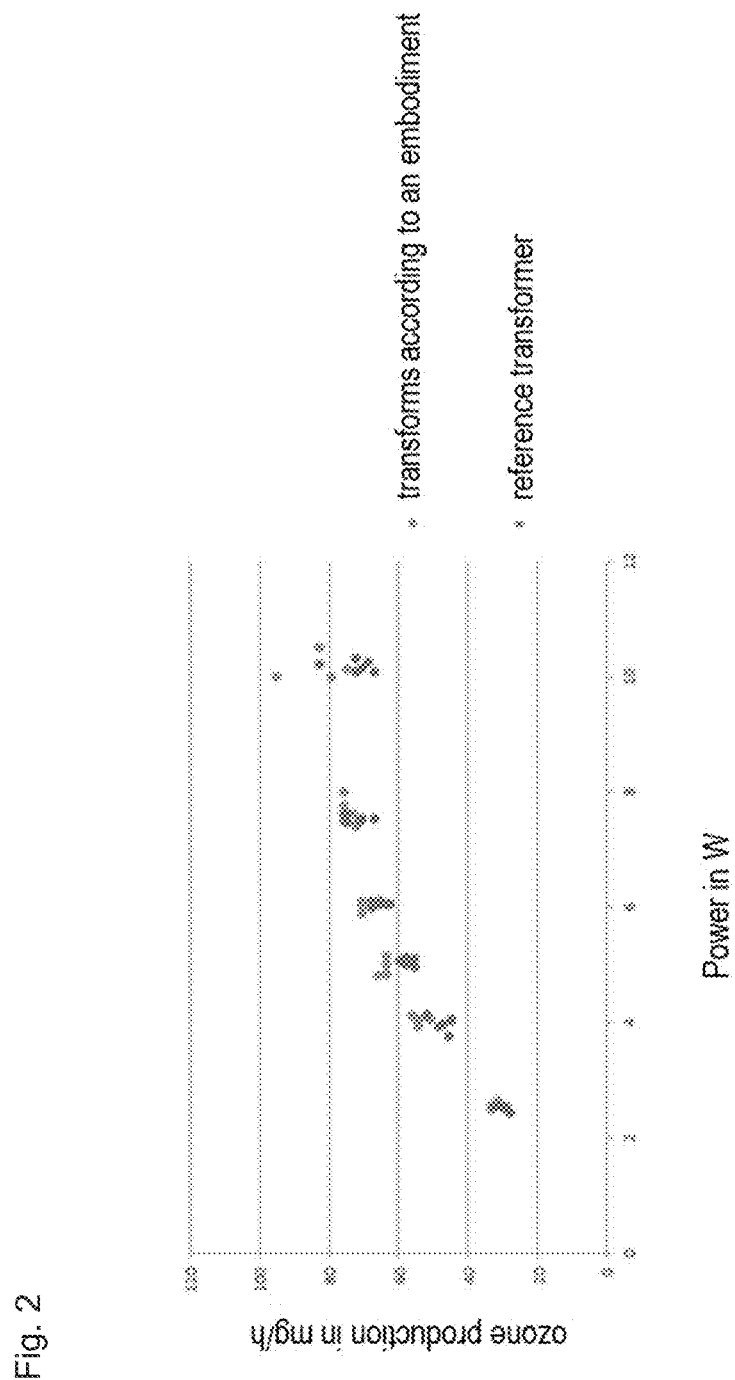
FIG. 2 shows the results of a measurement in which the ozone production for the piezoelectric transformer shown in FIG. 1 is compared with a comparative example.

FIG. 2 shows the measurement results of a comparative measurement in which a piezoelectric transformer 1 in accordance with the first exemplary embodiment was compared with a comparative transformer comprising a length of 71 mm and an end side having the cross section of 6 mm×3 mm. In both cases, air was used as process gas and ionized by the respective piezoelectric transformer 1.

In FIG. 2, the power in W with which the respective piezoelectric transformer 1 was operated is plotted on the abscissa axis. The produced amount of ozone in mg/hour is plotted on the ordinate axis. The measurement results shown in FIG. 2 show that no significant difference in ozone production can be found. In particular, with the piezoelectric transformer 1 having the advantageous aspect ratio of ≤20:1, a substantially identical amount of ozone can be produced for the same input power, wherein the piezoelectric transformer 1 having the aspect ratio of ≤20:1 comprises a significantly shorter length than the comparative transformer.

Figure 3:
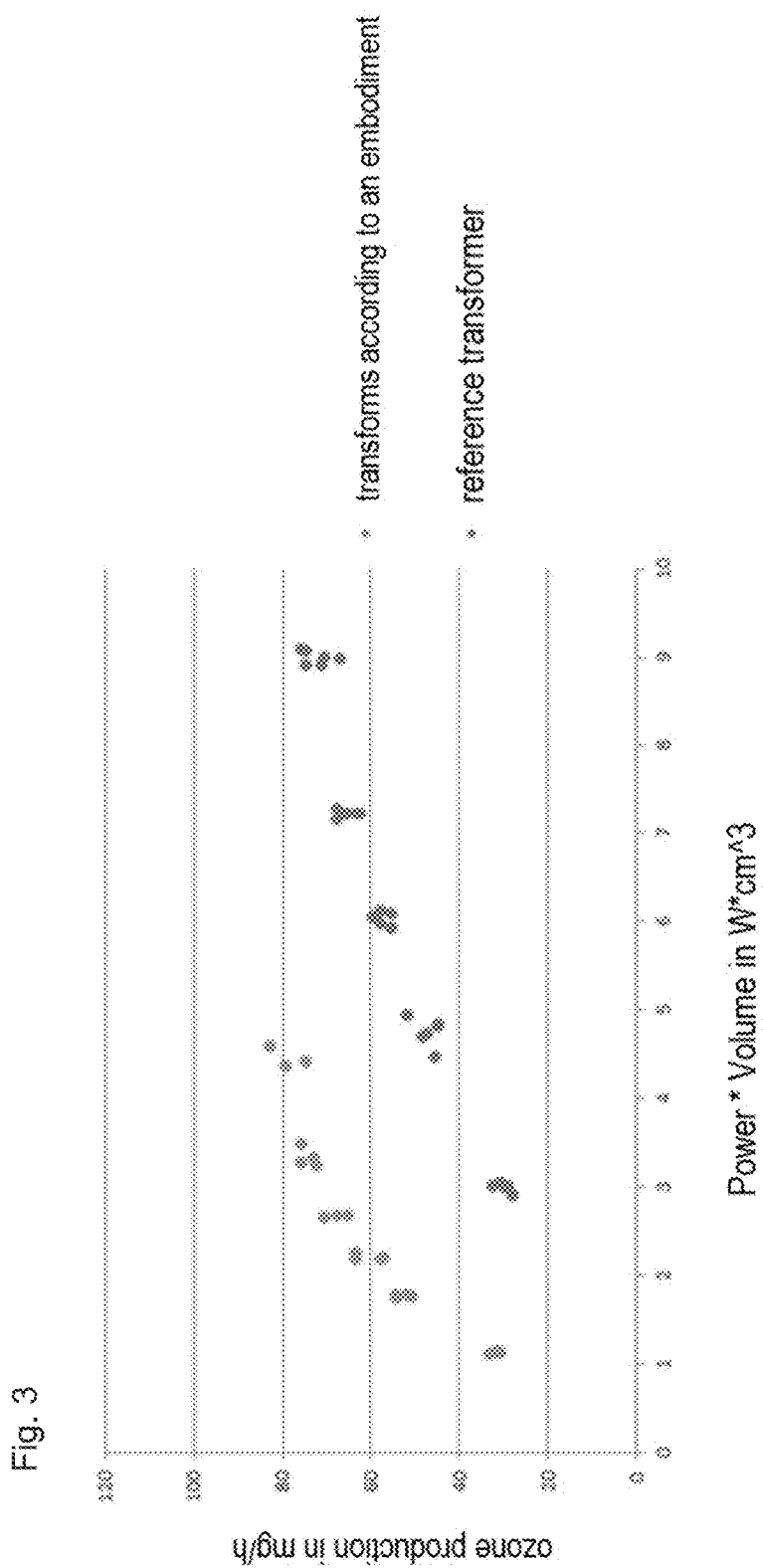
FIG. 3 shows the measurement results of a measurement with consideration of the ozone generation per unit volume.

FIG. 3 likewise illustrates a comparison between the piezoelectric transformer in accordance with the first exemplary embodiment and the comparative transformer, which does not have the preferred aspect ratio of ≤20:1. A product of input power and volume of the respective transformer is considered here. The product of input power and volume in W×cm$^3$ is plotted on the abscissa axis. The amount of ozone in mg generated per hour is once again plotted on the ordinate axis. Air was once again used as process gas. It is clearly evident that the piezoelectric transformer 1 having the preferred aspect ratio produces a larger amount of ozone per unit volume. Accordingly, this piezoelectric transformer 1 has a higher ozone generation efficiency.

This experimentally observed improvement in the ozone generation efficiency in air on account of the advantageous aspect ratio can also be explained theoretically. The ozone generation efficiency is dependent on the matching of the output impedance of the piezoelectric transformer 1 to the impedance generated by the plasma, and also on the steepness of the edges of the output voltage. In the case of a sinusoidal voltage, the edge steepness of the output voltage is substantially dependent on the resonant frequency. Accordingly, piezoelectric transformers 1 whose longest side 13 comprises a short length and which accordingly have a high resonant frequency have steep edges, which in turn have a positive effect on the ozone generation efficiency.

It was furthermore possible to show that the advantageous aspect ratio improves the matching of the impedance of the piezoelectric transformer 1 to an impedance generated by the plasma.

Both the longitudinal edges 11 and the edges 12 of the output-side end side of the piezoelectric transformer can be rounded. If the curve radius of the rounded edges is chosen to be sufficiently small, for example, less than 0.5 mm, the piezoelectric transformer 1 can be regarded approximately as parallelepipedal.

In some exemplary embodiments of the piezoelectric transformer 1, the latter comprises in the output region 3 an insulating layer formed, for example, by a shrinkable sleeve. The insulating layer can leave free the output-side end side 10 and at least partly cover the remaining side surfaces of the output region 3. The insulating layer is intended to prevent undesired plasma ignitions along the lateral longitudinal edges 11 and to cover the latter for this purpose. Since plasma ignitions along the lateral longitudinal edges 11 are not expected on account of the advantageous aspect ratio, the piezoelectric transformer 1 can be free of the insulating layer in the output region 3. In an alternative exemplary embodiment, such an insulating layer can be provided in order to further improve the insulation of the output region 3.

What is claimed is:

1. A method for generating a plasma using a piezoelectric transformer, the method comprising:
    applying an AC voltage to an input region;
    converting, by the input region, the AC voltage into a mechanical oscillation;
    converting, by an output region, the mechanical oscillation into an electrical voltage; and
    igniting the plasma at an output-side end side of the piezoelectric transformer,
    wherein the piezoelectric transformer comprises the input region and the output region,
    wherein the piezoelectric transformer comprises a longest edge and a shortest edge, and
    wherein the longest edge comprises a length that is twenty times a length of the shortest edge or less.
2. The method according to claim 1, wherein the longest edge comprises the length of less than 45 mm.
3. The method according to claim 1, wherein the longest edge comprises the length of less than 35 mm.
4. The method according to claim 1,
    wherein a first external electrode is arranged on a first side surface of the input region,
    wherein a second external electrode is arranged on a second side surface of the input region, the second side surface arranged opposite the first side surface,
    wherein the input region comprises piezoelectric layers and electrodes stacked one above another in a stacking direction,
    wherein the electrodes are contacted either with the first external electrode or with the second external electrode alternately in the stacking direction, and
    wherein the output region comprises a monolithic piezoelectric layer.
5. The method according to claim 1, wherein the longest edge extends from the input region to the output region.
6. The method according to claim 1, wherein the shortest edge is perpendicular to the longest edge.
7. The method according to claim 1, wherein the piezoelectric transformer has a resonant frequency of more than 100 kHz.
8. The method according to claim 1, wherein the longest edge comprises the length that is fifteen times the length of the shortest edge of the piezoelectric transformer or less.
9. The method according to claim 1, wherein the shortest edge comprises a length of between 10 mm and 1 mm.
10. The method according to claim 1, further comprising:
    avoiding plasma ignitions along the longest edge in the output region based on a ratio of the length of the longest edge to the length of the shortest edge.
11. The method according to claim 1, further comprising:
    reducing mechanical loadings of a piezoelectric material in the output region by a ratio of the length of the longest edge to the length of the shortest edge.
12. The method according to claim 1, further comprising:
    generating a high potential difference between the output-side end side of the piezoelectric transformer and an environment of the piezoelectric transformer, wherein the potential difference is sufficient to generate a strong electric field that ionizes a process gas.
13. The method according to claim 1, further comprising using the piezoelectric transformer for a medical application.
14. The method according to claim 1, further comprising using the piezoelectric transformer for cutting tissue by plasma cutting.
15. The method according to claim 1, wherein the edges of the piezoelectric transformer are rounded with a radius of ≤0.5 mm.
16. The method according to claim 1, further comprising matching an impedance of the piezoelectric transformer to an impedance generated by the plasma.
17. The method according to claim 1, wherein a maximum of an output potential generated by the piezoelectric transformer lies on an end side of the output region.
18. The method according to claim 1, further comprising generating, by the piezoelectric transformer, ozone when air is a process gas.
19. The method according to claim 1, further comprising generating, by the piezoelectric transformer, 30-35 mg/h ozone for 1 $Wcm^3$, or 50-55 mg/h ozone for 2 $Wcm^3$, or 70-75 mg/h ozone for 3 $Wcm^3$.
20. A medical device comprising:
    a plasma generator comprising a piezoelectric transformer configured to generate a plasma,
    wherein the piezoelectric transformer comprises an input region and an output region,
    wherein the input region is configured to convert an AC voltage into a mechanical oscillation,
    wherein the output region is configured to convert the mechanical oscillation into an electrical voltage,
    wherein the piezoelectric transformer comprises a longest edge and a shortest edge, and
    wherein the longest edge comprises a length that is twenty times the length of the shortest edge or less.
21. The medical device to claim 20, wherein the medical device is configured to cut tissue by plasma cutting.
22. A method for generating a plasma using a piezoelectric transformer, the method comprising:
    applying an AC voltage to an input region;
    converting, by the input region, the AC voltage into a mechanical oscillation;
    converting, by an output region, the mechanical oscillation into an electrical voltage; and
    igniting the plasma at an output-side end side of the piezoelectric transformer,
    wherein the piezoelectric transformer comprises the input region and the output region,
    wherein the piezoelectric transformer comprises a longest edge and a shortest edge,
    wherein the longest edge comprises a length that is twenty times a length of the shortest edge or less,
    wherein a location, at which a maximum of an electrical potential generated by the piezoelectric transformer is attained, shifts depending on a capacitance of the output region, and
    wherein the capacitance of the output region increases as a ratio of the length of the longest edge to the length of the shortest edge decreases.
23. A medical device comprising:
    a plasma generator comprising a piezoelectric transformer configured to generate a plasma,
    wherein the piezoelectric transformer comprises an input region and an output region,
    wherein the input region is configured to convert an AC voltage into a mechanical oscillation, wherein the output region is configured to convert the mechanical oscillation into an electrical voltage, wherein the piezoelectric transformer comprises a longest edge and a shortest edge, wherein the longest edge comprises a length that is twenty times the length of the shortest edge or less, wherein the piezoelectric transformer is configured such that a location, at which a maximum of an electrical potential, shifts depending on a capacitance of the output region, and wherein the piezoelectric transformer is further configured that the capacitance of the output region increases as a ratio of the length of the longest edge to the length of the shortest edge decreases.

\* \* \* \* \*